United States Patent [19]

Sanders

[11] Patent Number: 4,933,962
[45] Date of Patent: Jun. 12, 1990

[54] CONTINUITY TEST SET WITH VOICE COMMUNICATION

[75] Inventor: Thomas W. Sanders, Corinth, Miss.

[73] Assignee: Alcatel Business Systems, Corinth, Miss.

[21] Appl. No.: 408,603

[22] Filed: Sep. 18, 1989

[51] Int. Cl.⁵ .............................................. H04B 3/46
[52] U.S. Cl. ...................................... 379/21; 379/25; 379/26; 324/542
[58] Field of Search .................... 379/21, 25, 26, 1; 324/530, 539, 542, 158 F, 158 P

[56] References Cited

U.S. PATENT DOCUMENTS

| | | |
|---|---|---|
| 1,560,278 | 11/1925 | Mahan . |
| 2,799,739 | 7/1957 | Lowman et al. . |
| 3,792,205 | 2/1974 | O'Dea ................................. 379/21 |
| 4,388,501 | 6/1983 | Ahuja . |
| 4,588,862 | 5/1986 | Grabowy . |
| 4,777,645 | 10/1988 | Faith et al. ............................ 379/31 |

OTHER PUBLICATIONS

"Improved Pair Identification Cuts Cable Handling Costs", D. R. Connally and A. L. Pence, *Telephony,* Aug. 9, 1971, pp. 68–72.

*Primary Examiner*—Stafford D. Schreyer
*Attorney, Agent, or Firm*—Peter C. Van Der Sluys

[57] ABSTRACT

First and second telephone handsets or headsets are used to form a continuity test set providing voice communication. The telephone handsets are modified to connect the transmitter and receiver elements in series with test leads and current-limiting resistors. Connectors are provided at the ends of the test leads, and one of said handsets is provided with a battery to establish a loop current. LEDs are disposed in selected test leads to provide a visual indication of the flow of loop current, which is established when the connectors are attached to common conductors at the remote ends of a multiconductor cable or conduit.

17 Claims, 1 Drawing Sheet

CONTINUITY TEST SET WITH VOICE COMMUNICATION

BACKGROUND OF THE INVENTION

1. Field of the Invention

The present invention relates to an apparatus for identifying and selecting conductors in a multi-conductor cable or conduit, the ends of which are located remote from each other. The invention more particularly relates to such an apparatus which further provides for voice communication between workers located at each end.

2. Description of the Prior Art

The sorting and testing of electrical wires within multi-conductor cables or conduits is a time-consuming and tedious process contributing greatly to the installation cost and time. The task is particularly difficult when the cable or conduit ends are located remote from each other, so that workmen on each end are not in visual or audible contact. The provision of voice communication between workers at each end of the cable or conduit significantly simplifies the task. When sorting and testing conductors during the construction of large buildings, it is particularly difficult to provide voice communication between workers on different floors, since the metal building structure interferes with radio communications.

The above-mentioned difficulty is experienced in many different fields, such as the installation of electrical wiring and the installation and maintenance of video and/or telephone cables.

A typical method of identifying conductors in cables or conduits requires the services of at least two workmen, one at each end. One workman selects a suitable pair of conductors and imposes a tone across said pair, while the other workman at the other end of the cable uses a probe, amplifier and suitable receiver in an attempt to identify the tone as he probes the various conductors within the cable. After a conductor pair is identified, suitable equipment may then be used to establish voice communication between the workmen. The selecting process then continues with a tone being applied to another pair by one workman, while the other again probes to identify the second pair. During initial installation any electrical signal can be used; however, for subsequent testing, signals must be used that do not interfere with the normal use of the conductors.

The above-mentioned difficulty was described in an article, "Improved Pair Identification Cuts Cable Handling Costs", printed in *Telephony*, dated Aug. 9, 1971, at pp. 68–72. The article points out the need for various types of tone generators to generate a 'silent tone' which cannot be heard by the telephone subscribers and which would not interfere with special telephone circuits. The article recommends that an extra talk pair be provided for communication between the two men performing the identification and selection.

A more sophisticated pair identifying apparatus is disclosed in U.S. Pat. No. 2,799,739, which provides for the identification of cable pairs in a telecommunications system, wherein only one splicer is required at a location remote from a central office.

The prior art apparatus are either inconvenient to use or are complex and expensive and not particularly adaptable to the rugged handling associated with initial installations at construction sites. There clearly was a need for a convenient, inexpensive and rugged continuity tester that included voice communication capability, a pair reversal indication, and a conductor short indication.

SUMMARY OF THE INVENTION

The present invention contemplates an apparatus for sorting and testing conductors within a cable or conduit. The invention facilitates voice communication between workers at each end of the cable, and also provides visual indications of the proper identification of a conductor, conductor pair reversals and conductor shorts.

The present invention is particularly unique because of its simplicity and exceedingly low cost, while providing the functions of the more complex and expensive equipment available in the prior art and more. The invention provides high-quality voice communication over several miles of standard 26-gauge wire and is therefore applicable for use in both building construction and the installation of long lengths of video or telephone cables The present invention is simple and ruggedly constructed using two standard handsets or headsets modified by the addition of a battery in one of the sets to provide loop current, a resistor to limit loop current, and LEDs for providing visual indications.

The primary object of the present invention is to provide a continuity test set with voice communication.

Another objective of the present invention is to provide a low-cost continuity test set using standard available handsets or headsets.

Another objective of the present invention is to provide a continuity test set having visual indications.

Another objective of the present invention is to provide a continuity test set having visual indications that a conductor has been properly identified, that a conductor pair is reversed, or that a conductor is shorted.

DETAILED DESCRIPTION OF THE INVENTION

Figure 1:
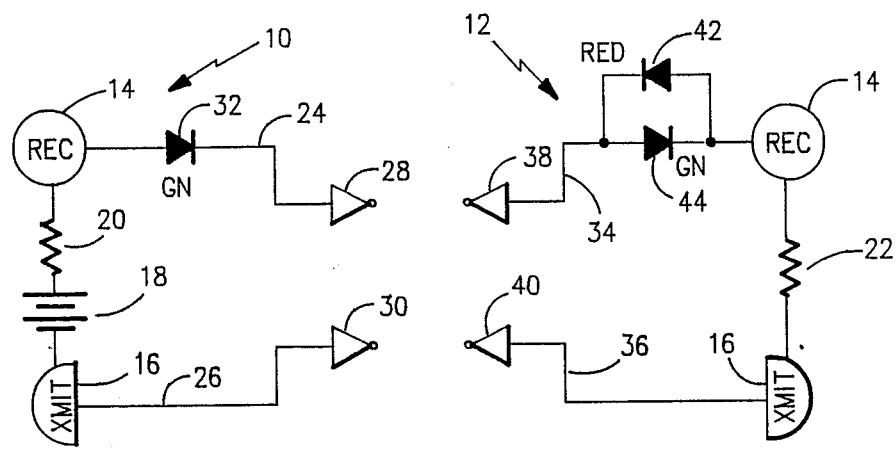
FIG. 1 is a schematic diagram of the continuity test set of the present invention.

Referring to FIG. 1, there is shown a first embodiment of the present invention comprising two units 10 and 12. Each unit is formed of a standard handset or headset modified with additional components. A typical handset that may be used is Part No. 0065XX0M2COM sold by Corinth Telecommunications Corp. These handsets include a receiver 14 and a transmitter 16. The handset of unit 10 is modified by the installation of a battery 18, which may be a standard 9-volt battery, installed within the handset and electrically connected with a standard snap connector between the receiver and transmitter. A positive (+) terminal of battery 18 is connected to the receiver 14 through a 47-ohm low-wattage resistor 20, while a negative (−) terminal of battery 18 is connected directly to the transmitter 16. Battery 18 is provided to establish a loop current when the tester is in use, and the resistor is provided to limit loop current and provide overload protection. The handset of unit 12 is provided with a 47-ohm low-wattage resistor 22 connected between the receiver and transmitter elements. Resistor 22 acts in conjunction with resistor 20 to limit loop current and provide overload protection.

Test leads 24 and 26 of a convenient length are connected respectively to the receiver and to the transmitter of the handset of unit 10 and are terminated with test probes 28 and 30, which may also be in the form of alligator clips or application-specific connectors. A green LED 32 is connected in test lead 24 and is oriented in relation to the battery 18 to pass the loop current.

Unit 12 has test leads 34 and 36 of a convenient length extending from the receiver and transmitter and terminating by test probes 38 and 40, which may be alligator clips or application-specific connectors. A pair of LEDs 42 and 44 are connected to each other in parallel with reverse polarity and are inserted in series with test lead 34. LED 42 is a red LED and is oriented to block the normal loop current, while LED 44 is green and is oriented to pass the normal loop current.

Each of the units 10 and 12 form series circuits which, when connected by conductors between probes 28 and 38 and probes 30 and 40, form a continuous loop through which current can flow and over which voice communication can be made.

When using the invention, the workers are located at opposite ends of a cable or conduit in which there has been previously installed a plurality of conductors. A worker using unit 10 connects probe 30 preferably to a common ground, such as a metal building frame or a ground wire within the cable or conduit. Thereafter, the worker connects probe 28 to a first conductor to be identified. The other worker, using unit 12, first connects the probe 40 to the common ground and thereafter uses probe 38 to sequentially connect to the conductors in the cable or conduit. When the other end of the conductor to which probe 28 is connected is contacted by probe 38, the green LEDs 32 and 44 on units 10 and 12 light up, and two-way voice communication is established between the two workers. The workers may then discuss subsequent actions after properly identifying the conductor.

If when the worker using unit 10 connects probe 28 to a conductor an abnormally bright emission is noted from LED 32 and no voice communication is made, it is an indication that the conductor to which probe 28 is connected is shorted to ground. The condition and identification of the conductor should be noted and another conductor selected.

In the event that a common ground is not available, unit 10 is merely connected to a pair of conductors, while the probe 40 of unit 12 is connected to any conductor and probe 38 is used to search. If the pair is not located, probe 40 must be moved to another conductor. This is a long and tedious process. Once a pair is identified either the green LEDs 32 and 44 will light or green LED 32 and red LED 42. If red LED 42 lights, it means that the pair is reversed. Once one pair is identified, one of the conductors can be used as a common ground for probes 30 and 40 and the identification process then becomes substantially faster.

After proper identification of a conductor, the worker using unit 10 connects probe 28 to another wire to be identified, and the worker using unit 12 begins a probing operation with probe 38 to identify the selected conductor.

It is to be understood that the circuit of FIG. 1 could be constructed using handsets or headsets. The LEDs of each unit could be mounted in the handset or in a housing associated with one of the probes of the particular unit. The battery could be located anywhere in the series circuit of unit 10 either in a handset, a headset or a probe housing. Unit 10 could be provided with a switch to prevent drainage on the battery in the event probes 28 and 30 are in contact during periods of non-use. The test leads could each be equipped with small fuses to provide further overload protection and worker safety in the event a probe makes contact with a hot wire.

Figure 2:
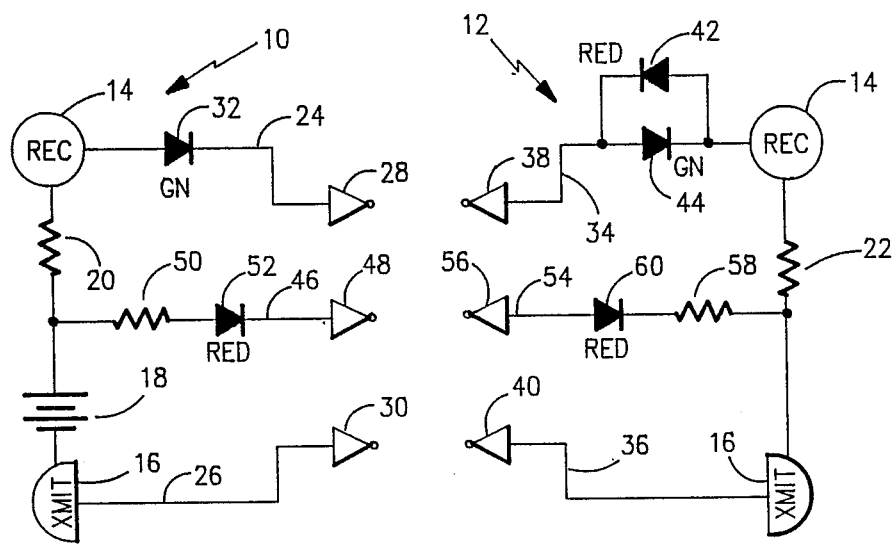
FIG. 2 is a schematic diagram of an alternate embodiment of the continuity test set of the present invention.

Referring to FIG. 2, there is shown an enhanced embodiment of the continuity tester of FIG. 1. Like elements in each of the figures are identified with like-numbered indicia.

The apparatus shown in FIG. 2 allows the workers to maintain voice communication while probing to identify another conductor. Unit 10 includes a third test lead 46 of convenient length connected between the positive (+) terminal of battery 18 and a test probe 48. Connected in series with test lead 46 is a resistor 50 having a resistance of 1,000 ohms and an LED 52, which may be red in color. LED 52 is oriented to pass loop current from battery 18. Unit 12 is provided with a third test lead 54 of convenient length having one end connected between the transmitter side of resistor 22 and a test probe 56. Connected in series with lead 54 is a 1,000-ohm resistor 58 and an LED 60, which may be red in color.

When using the embodiment shown in FIG. 2, the worker using unit 10 connects test lead 30 to a common ground point and connects test probe 28 to a wire to be identified in a manner identical to that followed using the embodiment of FIG. 1. The other worker using unit 12 connects probe 40 to a common ground and uses probe 38 to search for the conductor to be identified in a manner similar to that used in the embodiment of FIG. 1. The LEDs 32, 42 and 44 provide the same indications as do the LEDs of FIG. 1.

If the LED 32 of unit 10 is brighter than normal, it may be an indication that a short-circuit exists, especially if no voice communication is made. The user of unit 10 can verify the short-circuit by touching the probe 48 to the probe 28, which would result in LED 52 lighting if a short-circuit exists. The worker can then continue using probe 48 to locate a conductor that is not shorted. He would then attach probe 28 to that conductor and wait for the other worker to identify that wire and establish voice communication.

Once voice communication has been established using probes 28 and 38, the conductor to which these probes are attached could continue to be used to maintain voice communication, while probes 48 and 56 could then be used to identify other conductors while voice communication is maintained. When using probes 48 and 56 to identify additional conductors, the lighting of LEDs 52 and 60 will indicate that a conductor has been identified, whereas the lighting of LED 52 alone will again indicate a shorted conductor. The wire reversal detection feature provided by LEDs 42 and 44 would not be necessary at this point of the process, since a common ground has already been established, and no wire reversal could take place.

In the figures, resistors 20 and 22 are shown disposed between the receivers and transmitters; however, it is to be understood that these resistors are merely for the purpose of limiting loop current and could be disposed anywhere within the loop. In fact, a single resistor could be used instead of the two separate resistors if the units are fuse-protected. If no fuses are used in the units, the resistors 20 and 22 provide a fuse type function to protect the units, but not necessarily the safety of the workers. In a like manner, battery 18 could be located anywhere within the loop, provided its polarity in relation to the polarity of the LEDs is maintained. Resistors 50 and 58 could be combined into a single resistor, if fuses are inserted in each of the test leads.

From the above, it is apparent that the present invention provides an extremely simple continuity tester with voice communication. The invention is particularly inexpensive to manufacture, while being rugged and extremely easy to operate, thereby being adaptable to a construction environment. The continuity tester of the present invention provides for the identification of conductors, identification of shorted conductors, and identification of a wire reversal in the case of a wire pair being identified. Construction of the invention using a headset allows for continued voice communication, leaving the hands free for probing.

What is claimed is:

1. An apparatus for identifying a conductor in a multi-conductor installation, the ends of which are remotely spaced from each other, said apparatus comprising:
    a first unit including voice communication transmitting means, voice communication receiving means, electrical connecting means connecting said transmitting and receiving means, first and second test leads each connected at one end to one of said transmitting and receiving means, first and second probe means connected respectively to the other ends of said first and second test leads, said transmitting means, receiving means, electrical connecting means, test leads and probe means being connected in a series circuit with the probe means at each end;
    a second unit including voice communication transmitting means, voice communication receiving means, electrical connecting means connecting said transmitting and receiving means, first and second test leads each connected at one end to one of said transmitting and receiving means, first and second probe means connected respectively to the other ends of said first and second test leads, said transmitting means, receiving means, electrical connecting means, test leads and probe means being connected in a series circuit with the probe means at each end;
    means connected in series with one of said series circuits for providing a potential to establish a loop current;
    means disposed in at least one of said series circuits for limiting said loop current; and
    means disposed in each of said series circuits for providing a visual indication of the flow of loop current through the series circuit in which said means is disposed, so that when the first and second probe means of the first unit are connected to the first and second probe means of the second unit through conductors of said installation, a loop current will flow, the means for providing a visual indication will provide said indication, and voice communication will be established between the ends of the multi-conductor installation.

2. An apparatus as described in claim 1, wherein the voice communication transmitting means and the voice communication receiving means of said first and second units are components of a telephone handset.

3. An apparatus as described in claim 1, wherein the voice communication transmitting means and the voice communication receiving means of said first and second units are components of a telephone headset.

4. An apparatus as described in claim 1, wherein said loop current limiting means comprises a resistor disposed in each of the series circuits of said first and second units.

5. An apparatus as described in claim 1, wherein the means for providing visual indication comprises LEDs disposed in the series circuits of the first and second units, said LEDs being oriented to conduct the loop current established by the means for providing a potential.

6. An apparatus as described in claim 5, wherein the series circuit of the unit not having the means for providing potential includes another LED connected in parallel with the LED, but oriented with an opposite polarity to provide an indication of a conductor pair reversal.

7. An apparatus as described in claim 1, wherein each said series circuit of said first and second units includes a fuse means.

8. An apparatus as described in claim 1, wherein each said test lead of said first and second units includes a fuse means.

9. An apparatus as described in claim 1, wherein the series circuit having the means for providing potential additionally includes a switch means for opening said series circuit.

10. An apparatus as described in claim 1, additionally comprising:
    a third test lead for each of said first and second units, each of said third test leads including a series connected visual indicating means and a probe means at one end and being connected at another end to the series circuits of said first and second units, said connection being relative to the means for providing a potential so that loop current flows through said third test leads when the probe means of said third test leads are connected to the same conductor; and
    loop current limiting means disposed in at least one of said third test leads.

11. An apparatus as described in claim 10, wherein the voice communication transmitting means and the voice communication receiving means of said first and second units are components of a telephone handset.

12. An apparatus as described in claim 10, wherein the voice communication transmitting means and the voice communication receiving means of said first and second units are components of a telephone headset.

13. An apparatus as described in claim 10, wherein said loop current limiting means comprises resistors.

14. An apparatus as described in claim 10, wherein the means for providing visual indication comprises LEDs disposed in the test leads of the first and second units, said LEDs being oriented to conduct the loop current established by the means for providing a potential.

15. An apparatus as described in claim 14, wherein the series circuit of the unit not having the means for providing potential includes a second LED connected in parallel with the first LED, but oriented with an opposite polarity to provide an indication of a conductor pair reversal.

16. An apparatus as described in claim 10, wherein each said series circuit of said first and second units includes a fuse means.

17. An apparatus as described in claim 10, wherein each said test lead of said first and second units includes a fuse means.

* * * * *